United States Patent [19]
Hofstetter et al.

[11] Patent Number: 6,136,623
[45] Date of Patent: *Oct. 24, 2000

[54] MULTIPLE WAVELENGTH LASER ARRAYS BY FLIP-CHIP BONDING

[75] Inventors: Daniel Hofstetter, Sunnyvale; Clarence J. Dunnrowicz, Santa Cruz; Decai Sun, Sunnyvale; Ross D. Bringans, Cupertino; Michael A. Kneissl, Sunnyvale, all of Calif.

[73] Assignee: Xerox Corporation, Stamford, Conn.

[ * ] Notice: This patent is subject to a terminal disclaimer.

[21] Appl. No.: 09/073,598

[22] Filed: May 6, 1998

[51] Int. Cl.[7] .................................................. H01L 21/00

[52] U.S. Cl. ................................................. 438/28; 372/50

[58] Field of Search ................................. 372/50; 438/28

[56] References Cited

U.S. PATENT DOCUMENTS

| | | | |
|---|---|---|---|
| 5,150,372 | 9/1992 | Abramov et al. | 372/34 |
| 5,384,797 | 1/1995 | Welch et al. | 372/23 |
| 5,640,188 | 6/1997 | Andrews | 372/36 |
| 5,644,586 | 7/1997 | Kawano et al. | 372/44 |
| 5,920,766 | 7/1999 | Floyd | 438/35 |
| 5,999,553 | 12/1999 | Sun | 372/50 |

*Primary Examiner*—Richard Elms
*Assistant Examiner*—Christian D. Wilson
*Attorney, Agent, or Firm*—William Propp

[57] ABSTRACT

This invention relates to a multiple wavelength laser structure, and more particularly, to a multiple wavelength laser array structure fabricated by flip-chip bonding from laser structures on two different substrates. A side by side red/IR laser structure is flip-chip bonded to a blue laser structure to form a red/blue/IR hybrid integrated laser structure.

6 Claims, 7 Drawing Sheets

MULTIPLE WAVELENGTH LASER ARRAYS BY FLIP-CHIP BONDING

BACKGROUND OF THE INVENTION

This invention relates to a multiple wavelength laser structure and, more particularly, to a multiple wavelength laser array structure fabricated by flip-chip bonding from laser structures on two different substrates.

Addressable monolithic multi-wavelength light sources, especially arrays that can simultaneously emit different wavelength light beams from different laser elements in the monolithic structure, are useful in a variety of applications such as color printing, full color digital film recording, color displays, and other optical recording and storage system applications.

The performance of many devices, such as laser printers and optical memories, can be improved by the incorporation of multiple laser beams. For example, laser printers which use multiple beams can have higher printing speeds and/or better spot acuity than printers which use only a single beam.

In these and many applications, closely spaced laser beams of different wavelengths are desirable.

One way to obtain closely spaced laser beams is to form multiple laser emission sites, or laser stripes, on a common substrate. While this enables very closely spaced beams, prior art monolithic laser arrays typically output laser beams at only one wavelength.

Various techniques are known in the prior art for producing different wavelength laser beams from a monolithic laser array. For example, it is well known that a small amount of wavelength difference can be obtained by varying the drive conditions at each lasing region. However, this easily achievable but small wavelength difference is insufficient for most applications.

Ideally, for most desired applications, the laser elements should emit light of different, widely spaced, wavelengths. In a preferred monolithic structure, the laser elements would emit light across a widely spaced spectrum from infrared to red to blue wavelengths. One problem is that laser sources of different wavelengths require different light emission active layers; i.e. nitride semiconductor layers such as InGaAlN for blue lasers, arsenide semiconductor layers such as AlInGaAs for infrared and phosphide semiconductor layers such as GaInP for red lasers.

One method of achieving these larger wavelength separations is to grow a first set of active layers on a substrate to form a first lasing element which outputs light at one wavelength, and then to etch and regrow a second set of active layers next to the first to form a second lasing element at a second wavelength. However, this method requires separate crystal growths for each lasing element, something which is not easily performed. Furthermore, the arsenide and phosphide semiconductor structures of infrared and red lasers use a different, non-compatible substrate with the nitride semiconductor structures of blue lasers. Lattice mismatching between semiconductor layers will result in poor or non-existent performance of one or more of the laser structures.

Another technique for obtaining different wavelength laser beams from a monolithic laser array is to use stacked active regions. A stacked active region monolithic array is one in which a plurality of active regions are sandwiched between common cladding layers. Each active region is comprised of a thin volume that is contained within a laser stripe. The laser stripes contain different numbers of active regions that emit laser beams at different wavelengths.

In a stacked active region monolithic laser array, current flows in series through the stacked active regions. The active region with the lowest bandgap energy will lase, thereby determining the wavelength of the laser beam output from that part of the array. To provide another wavelength output, the previously lowest bandgap energy active region is removed from part of the array and current is sent through the remaining stacked regions.

A major problem with stacked active region monolithic laser arrays is that they have been difficult to fabricate, even with just arsenide and phosphide semiconductor layers. The addition of nitride semiconductor layers makes optical performance nearly impossible and impractical in any real world applications.

Side by side laser arrays can not only output closely spaced laser beams of different wavelengths, but beneficially the output laser beams are aligned.

It is an object of this invention to provide multiple lasers in a monolithic structure capable of outputting closely spaced, multiple wavelength laser beams in the infrared to red to blue wavelength spectrum.

SUMMARY OF THE INVENTION

A side by side red/IR laser structure is flip chip bonded to a blue laser structure to form a red/blue/IR hybrid integrated laser structure. Laser array structures having elements of different wavelength can be fabricated by this method in semiconductor material systems which are incompatible for etch and regrowth manufacturing techniques.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

The present invention involves fabricating a Red/IR side by side laser structure, fabricating a Blue laser structure, flipping over the Red/IR stack laser structure to flip-chip bond the Red/IR side by side laser structure to the Blue laser structure and forming the resulting integrated Red/Blue/IR laser structure.

Figure 1:
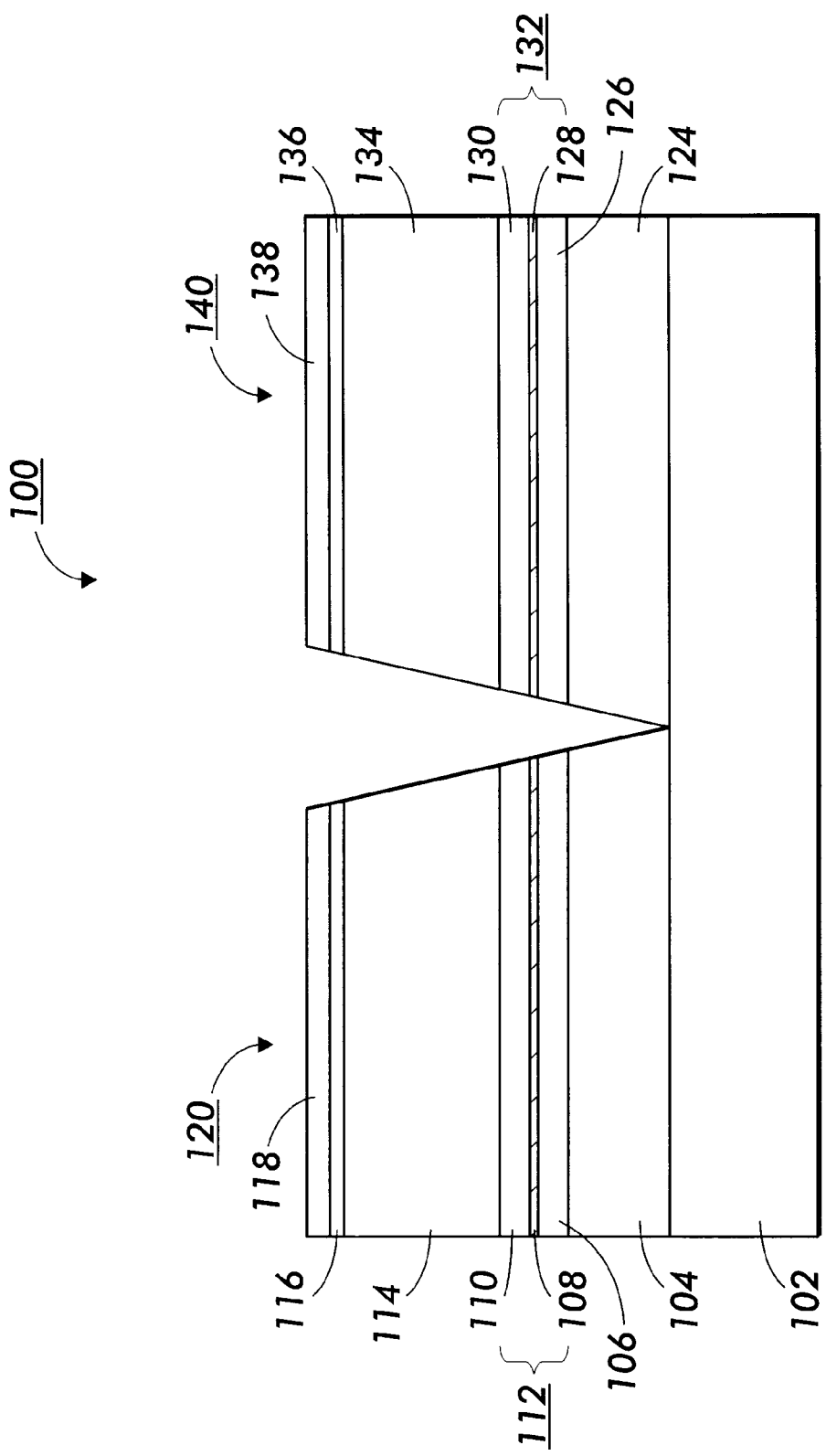
FIG. 1 is a cross-sectional side view of the semiconductor layers of the Red/IR side by side laser structure of the present invention.

Reference is now made to FIG. 1 which illustrates a Red/IR side by side laser structure 100 in accordance to the present invention.

As shown in FIG. 1, an n-type $Al_{0.5}In_{0.5}P$ lower cladding layer 104 is grown on an n-type GaAs substrate 102 using a well-known epitaxial deposition process commonly referred to as metal-organic chemical vapor deposition ("MOCVD"). Other deposition processes such as liquid phase epitaxy ("LPE"), molecular beam epitaxy ("MBE"), or other known crystal growth processes can also be used. The aluminum mole fraction and doping level of the lower cladding layer 104 range from 50 percent and 1 to $5 \times 10^{18}$ $cm^{-3}$ respectively. The thickness of the AlInP cladding layer 104 is approximately one micron ($\mu$m). The doping level of the n-type GaAs substrate 102 is approximately $5 \times 10^{18}$ $cm^{-3}$ or higher.

An undoped $Al_{0.4}Ga_{0.6}As$ lower confinement layer 106 is deposited on the cladding layer 104. The lower confinement layer 106 has an aluminum content of about 40% and a thickness of about 120 nanometers. After this lower confinement layer 106 has been deposited, an $In_{0.15}Ga_{0.7}As$ active layer 108 is deposited. The active layer 108 should emit light at approximately 835 nanometers. The active layer 108 may be a single quantum well, a multiple quantum well, or a layer with thickness greater than that of a quantum well. The thickness of a quantum well typically ranges from five to twenty nanometers and in this example is 8 nanometers. Upon the active layer 108 is deposited an undoped $Al_{0.4}Ga_{0.6}As$ upper confinement layer 110. The aluminum content of this confinement layer 110 is typically 40% and a thickness of about 120 nanometers. The lower and upper confinement layers, 106 and 110, together with the active layer 108, form the active region 112 for a laser structure with a lower threshold current and a smaller optical divergence.

Upon the upper confinement layer 110 in the infrared laser structure 120 is deposited a $Al_{0.5}In_{0.5}P$ upper cladding layer 114 of about one micron thickness. Typically, this upper cladding layer 114 has an aluminum content of 50% and a magnesium doping level of $5 \times 10^{18}$ $cm^{-3}$.

Upon the upper p-type $Al_{0.5}In_{0.5}P$ cladding layer 114 is deposited a barrier reduction $Ga_{0.5}In_{0.5}P$ layer 116, which typically has a thickness of 50 nanometers, and a magnesium doping level of approximately $5 \times 10^{18}$ $cm^{-3}$. Upon this barrier reduction GaInP layer 116 is deposited a p+–GaAs cap layer 118, which typically is 100 nanometers thick with a magnesium doping of $1 \times 10^{19}$ $cm^{-3}$.

These semiconductor layers 102 to 118 form the infrared laser structure 120.

The laser structure 100 of FIG. 1 with the epitaxially deposited infrared laser structure 120 is then covered with a silicon nitride ($SiN_x$) or silicon oxide ($SiO_x$) layer (not shown). Stripe windows are then opened in the silicon nitride or oxide layer by photolithography and plasma etching. The stripe windows (not shown) are 300 microns wide with 500 micron spacing. Wet chemical etching with citric acid ($C_6H_8O_7:H_2O$):hydrogen dioxide ($H_2O_2$) and bromine acid (HBr) is then used to etch away the infrared laser structure 120 layers of cap layer 118, barrier reduction layer 116, upper cladding layer 114, upper confinement layer 110, active layer 108, lower confinement layer 106 and lower cladding layer 104 in the window region down to the n-GaAs substrate 102. The red laser structure will then be grown on the substrate in the window region. Once the red laser structure has been deposited, the silicon nitride or oxide layer on top of the remaining infrared laser structure 120 will be removed by plasma etching.

An n-type $Al_{0.5}In_{0.5}P$ lower cladding layer 124 is deposited on the n-type GaAs substrate 102. The aluminum mole fraction and doping level of the lower cladding layer 124 range from 50 percent and 1 to $5 \times 10^{18}$ $cm^{-3}$ respectively. The thickness of the AlInP cladding layer 124 is approximately one micron ($\mu$m).

An undoped $In_{0.5}(Al_{0.6}Ga_{0.4})_{0.5}P$ lower confinement layer 126 is deposited on the lower cladding layer 124. The lower confinement layer 126 has an aluminum content of about 30% and a thickness of about 120 nanometers. After this lower confinement layer 126 has been deposited, an $In_{0.6}Ga_{0.4}P$ active layer 128 is deposited. The active layer 128 will emit light at approximately 670 nanometers. The active layer 128 may be a single quantum well, a multiple quantum well, or a layer with thickness greater than that of a quantum well. The thickness of a quantum well typically ranges from five to twenty nanometers and in this example is 8 nanometers. Upon the active layer 128 is deposited an undoped $In_{0.5}(Al_{0.6}Ga_{0.4})_{0.5}P$ upper confinement layer 130. The aluminum content of this confinement layer 130 is typically 30% and a thickness of about 120 nanometers. The lower and upper confinement layers, 126 and 130, together with the active layer 128, form an active region 132 for a laser structure with a lower threshold current and a smaller optical divergence.

Upon the upper confinement layer 130 in the red laser structure 140 is deposited a $Al_{0.5}In_{0.5}P$ upper cladding layer 134 of about one micron thickness. Typically, this upper cladding layer 134 has an aluminum content of 50% and a magnesium doping level of $5 \times 10^{18} cm^{-3}$.

Upon the upper p-type $Al_{0.5}In_{0.5}P$ cladding layer 134 is deposited a barrier reduction $Ga_{0.5}In_{0.5}P$ layer 136, which typically has a thickness of 50 nanometers, and a magnesium doping level of approximately $5 \times 10^{18}$ $cm^{-3}$. Upon this barrier reduction GaInP layer 136 is deposited a p+–GaAs cap layer 138, which typically is 100 nanometers thick with a magnesium doping of $1 \times 10^{19}$ $cm^{-3}$.

These semiconductor layers 102 and 124 to 138 form the red laser structure 140.

The infrared laser structure 120 and the red laser structure 140 have the same substrate 102. The upper and lower cladding layers and the barrier reduction and cap layers for the infrared laser structure 120 and the red laser structure 140 are the same semiconductor materials with the same thicknesses and the same doping or nondoping. Since the upper and lower confinement layers and the active layers of the infrared laser structure 120 and the red laser structure 140 are the same thickness (although different semiconductor materials), the active regions for light emission of the two laser structures 120 and 140 within the laser structure 100 are the same height and parallel. Similarly, the electrode contacts for the infrared laser structure 120 and the red laser structure 140 on the cap layers 118 and 138 will be the same height and parallel.

The infrared laser structure 120 and the red laser structure 140 of the side by side laser structure 100 can have accurate lateral spacing of 50 microns or less with zero or minimum vertical spacing between the side by side laser structures.

In the embodiments of the present invention, the infrared laser structure was grown first on the GaAs substrate followed by an etching and regrowth of the red laser structure.

Alternately for this invention, the red laser structure can be grown first on the GaAs substrate followed by an etching and regrowth of the infrared laser structure.

Figure 2:
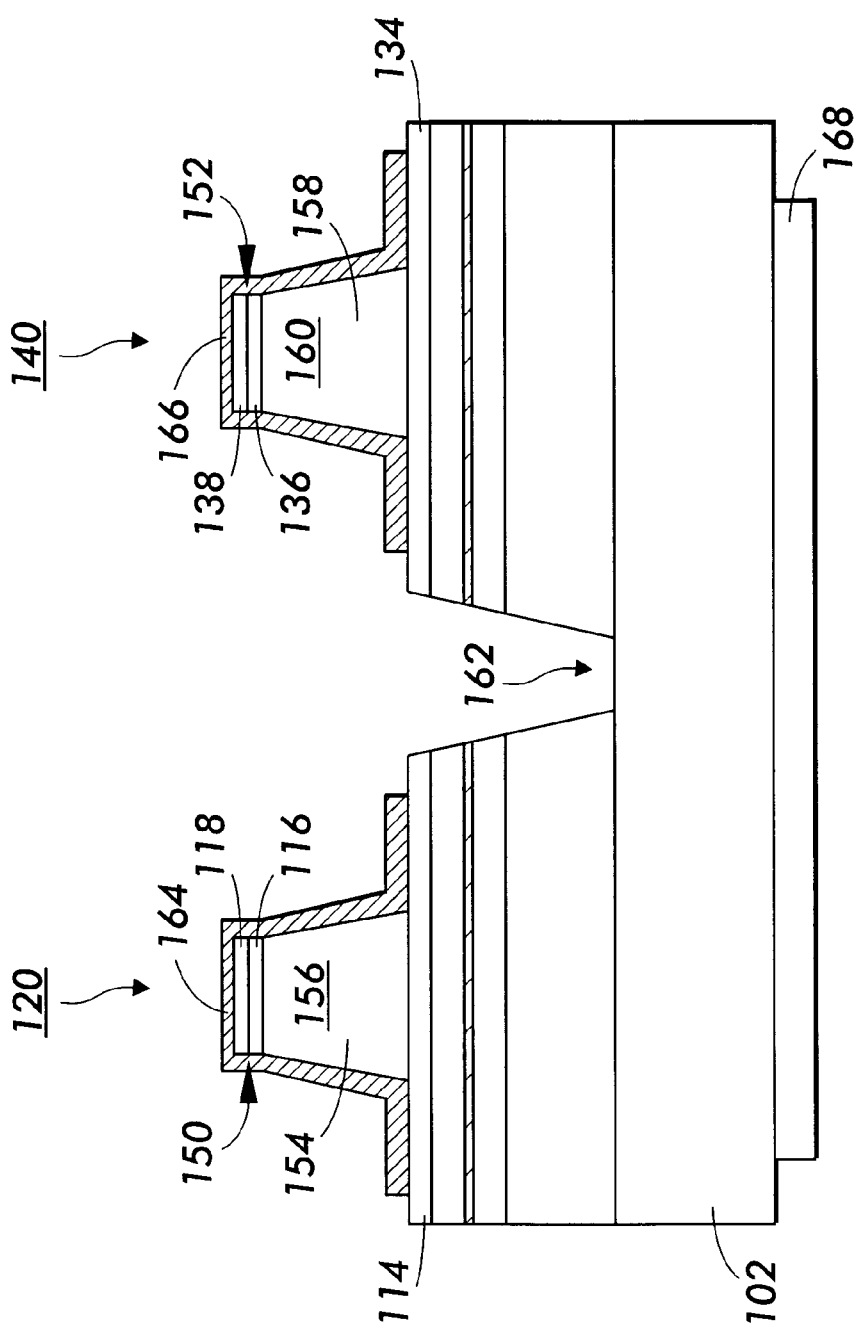
FIG. 2 is a cross-sectional side view of the semiconductor layers of the Red/IR side by side ridge waveguide laser structure of the present invention.

Ridge waveguides can be fabricated for the IR/Red side by side laser structure 100 of FIG. 2.

After all the semiconductor layers of the semiconductor structure 100 shown in FIG. 1 have been deposited, a silicon nitride ($SiN_x$) or silicon oxide ($SiO_2$) layer is deposited on the upper surface of the cap layer 118 of the infrared laser structure 120 and on the upper surface of the cap layer 138 of the red laser structure 140 in FIG. 2. Dual stripes of 50 micron spacing are patterned on the cap layers 118 and 138 leaving open windows between the stripes.

A mixed bromine methanol ($Br:CH_3OH$) solution etches through the unmasked portions of the cap layer 118 and barrier reduction layer 116 of the infrared laser structure 120 leaving a small mesa 150 of masked, and thus unetched, cap layer 118 and barrier reduction layer 116 between the open window grooves.

The mixed bromine methanol ($Br:CH_3OH$) solution also etches through the unmasked portions of the cap layer 138 and barrier reduction layer 136 of the red laser structure 140 leaving a small mesa 152 of masked, and thus unetched, cap layer 138 and barrier reduction layer 136 between the open window grooves.

Phosphoric acid ($H_3PO_4$) then etches the unmasked portions of the 1 micron thick p-type $Al_{0.5}In_{0.5}P$ upper cladding layer 114 on either side of the mesa 150 down to a 0.35 micron thick p-type $Al_{0.5}In_{0.5}P$ upper cladding layer 114 above the active region 112 of layers 110, 108 and 106 using a timed etching technique.

The phosphoric acid ($H_3PO_4$) also etches the unmasked portions of the 1 micron thick p-type $Al_{0.5}In_{0.5}P$ upper cladding layer 134 on either side of the mesa 152 down to a 0.35 micron thick p-type $Al_{0.5}In_{0.5}P$ upper cladding layer 134 above the active region 132 of layers 130, 128 and 126 using a timed etching technique.

Reactive ion etching may be used in place of wet chemical etching.

Upon completion of etching as shown in FIG. 2, the silicon nitride stripes are removed.

The remaining $Al_{0.5}In_{0.5}P$ upper cladding layer 154 under the mesa 150 forms the ridge waveguide 156 for optical confinement of the light emitted from the active region of the infrared laser structure 120.

The remaining $Al_{0.5}In_{0.5}P$ upper cladding layer 158 under the mesa 152 forms the ridge waveguide 160 for optical confinement of the light emitted from the active region of the red laser structure 140.

An isolation groove 162 is etched between the infrared laser structure 120 and the red laser structure 140 down to the substrate 102 to provide electrical and thermal isolation between the two laser structures in order to reduce crosstalk between the two laser structures.

After the removal of the silicon nitride stripes, a Ti-Au p-contact 164 can be deposited on the upper surface of the cap layer 118, the contact layer 116 and the upper cladding layer 114 for the infrared laser structure 120. The ridge waveguide 156 is confined by the metal p-contact 164. A Ti-Au p-contact 166 can be deposited on the upper surface of the cap layer 138, the contact layer 136 and the upper cladding layer 134 for the red laser structure 140. The ridge waveguide 160 is confined by the metal p-contact 166. An Au:Ge n-contact 168 can be deposited on the bottom surface of the substrate 102, common to both the infrared laser structure 120 and the red laser structure 140.

The infrared laser structure 120 with its metal confined ridge waveguide 156 and the red laser structure 140 with its metal confined ridge waveguide 160 will each emit a single transverse mode light emission.

The IR and red laser structures, although closely spaced side by side, are independently addressable with fast switching of less than 3 nanoseconds.

The IR/Red side by side laser structure 100 of FIG. 2 is an edge emitting array. Conventional facets (not shown) are provided on the edge of the laser structure 100. The infrared laser structure 120 will emit light of infrared wavelength from the active region 112 including the active layer 108 through the edge of the laser structure. The red laser structure 140 will emit light of red wavelength from the active region 132 including the active layer 128 through the edge of the laser structure.

Figure 3:
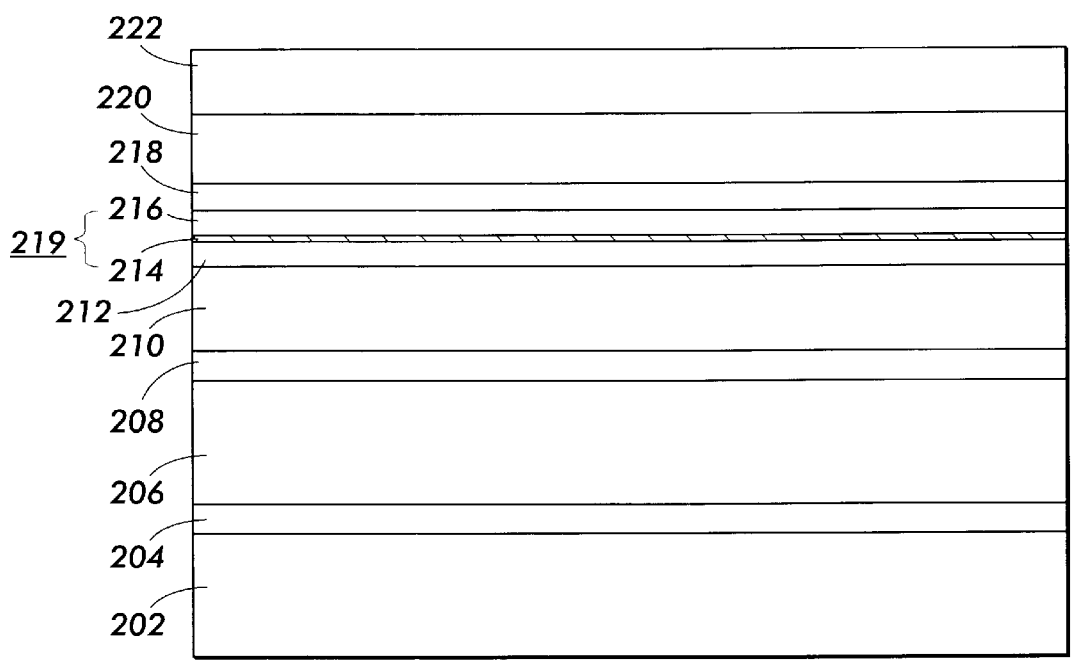
FIG. 3 is a cross-sectional side view of the semiconductor layers of the Blue laser structure of the present invention.

Reference is now made to FIG. 3 which illustrates a Blue laser structure 200 in accordance to the present invention.

The Blue laser structure 200 has a sapphire ($Al_2O_3$) substrate 202. Upon the substrate 200 is deposited an undoped GaN buffer layer 204 which has a thickness of 30 nanometers. A n-GaN buffer layer 206 is deposited on the undoped buffer layer 204. The n-buffer layer is silicon doped at $1 \times 10^{18}$ $cm^{-3}$ and has a thickness of 4 microns. A n-$In_{0.5}Ga_{0.95}N$ stress reduction layer 208 is deposited on the n-GaAs buffer layer 206. The InGaN stress reduction layer 208 has a thickness of 0.1 microns and a silicon doping level of $1 \times 10^{18}$ $cm^{-3}$. Upon the InGaN stress reduction layer 208 is deposited a n-$Al_{0.08}Ga_{0.92}N$ lower cladding layer 210. The n-cladding layer 210 is silicon doped at $1 \times 10^{18}$ $cm^{-3}$ and has a thickness of 0.5 microns.

An n-GaN waveguiding layer 212 is deposited on the n-AlGaN lower cladding later 210. The GaN waveguiding layer 212 is 0.1 microns thick and is silicon doped at $1 \times 10^{18} cm^{-3}$. An $In_{0.15}Ga_{0.85}N/In_{0.02}Ga_{0.98}N$ multiple quantum well active layer 214 is deposited on the waveguiding layer 212. The $In_{0.15}Ga_{0.85}N/In_{0.02}Ga_{0.98}N$ multiple quantum well active layer 214 has 3 to 20 quantum wells and is about 50 nanometers thick and emits light at 410 to 430 nanometers. A p-$Al_{0.2}Ga_{0.8}N$ carrier confinement layer 216 is deposited on the active layer 214. The p-AlGaN carrier confinement layer 216 is magnesium doped at $5 \times 10^{19}$ $cm^{-3}$ and has a thickness of 0.02 microns. An p-GaN waveguiding layer 218 is deposited on the p-AlGaN carrier confinement later 216. The GaN waveguiding layer 218 is 0.1 microns thick and is magnesium doped at $5 \times 10^{19}$ $cm^{-3}$. The waveguiding layers 212 and 218, together with the confinement layer 216 and the active layer 214 form the active region 219 of the laser structure.

A p-$Al_{0.08}Ga_{0.92}N$ upper cladding layer 220 is deposited on the waveguiding layer 218. The p-cladding layer 220 is magnesium doped to $5 \times 10^{19}$ $cm^{-3}$ and has a thickness of 0.5 microns. A p-GaN contact layer 222 is deposited on the p-confinement layer 220. The contact layer 222 is magnesium doped to $5 \times 10^{19}$ $cm^{-3}$ and has a thickness of 0.5 microns.

Figure 4:
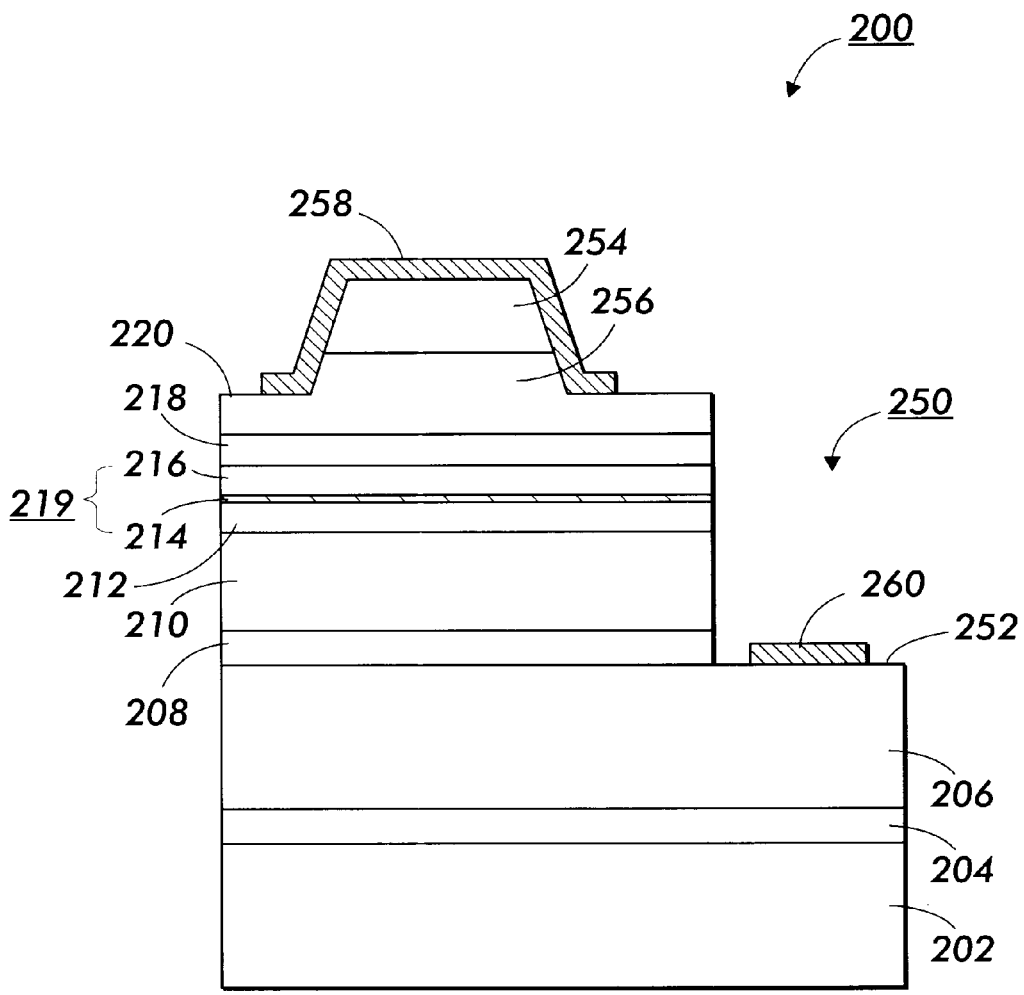
FIG. 4 is a cross-sectional side view of the semiconductor layers of the Blue ridge waveguide laser structure of the present invention.

Ridge waveguides can be fabricated for the blue laser structure 200 of FIG. 4.

After all the semiconductor layers of the semiconductor structure 200 shown in FIG. 3 have been deposited, a photoresist mask is deposited on the upper surface of the contact layer 222 of the blue laser structure 200. A stripe is patterned in the photoresist leaving an open section 250 of the contact layer 222. Chemically assisted ion beam etching ("CAIBE") then etches the unmasked portion 250 of the contact layer 222 through the contact layer 222, the p-upper cladding layer 220, the p-waveguiding layer 218, the p-carrier confinement layer 216, the multiple quantum well active layer 214, the n-waveguiding layer 212, the n-lower cladding layer 210, the n-stress reduction layer 208 to the surface 252 of the n-GaAs buffer layer 206. The photoresist mask is then removed.

Then, another photoresist mask is deposited on the upper surface of the contact layer 222 and the surface 252 of the exposed n-buffer layer 206 of the blue laser structure 200. Dual stripes of 50 micron spacing are patterned on the contact layer 222 leaving open windows between the stripes.

Chemically assisted ion beam etching then etches through the unmasked portions of the contact layer 222 leaving a small mesa 254 of masked, and thus unetched, contact layer 222 between the open window grooves.

Chemically assisted ion beam etching continues to etch the unmasked portions of the 0.5 micron thick p-type $Al_{0.08}Ga_{0.92}N$ upper confinement layer 220 on either side of the mesa 254 down to a 0.35 micron thick p-type $Al_{0.08}Ga_{0.92}N$ upper cladding layer 220 above the active region 219 of layers 212, 214, 216 and 218 using a timed etching technique.

Upon completion of etching, the photoresist mask is removed.

The remaining p-type $Al_{0.08}Ga_{0.92}N$ upper cladding layer 220 under the mesa 254 forms the ridge waveguide 256 for optical confinement of the light emitted from the active region of the blue laser structure 200.

After the removal of the silicon nitride stripes, a Ti-Au p-contact 258 can be deposited on the upper surface of the upper confinement layer 220, the ridge waveguide 256 and the mesa 254 of the contact layer 222 for the blue laser structure 200. The ridge waveguide 256 is confined by the metal p-contact 258. A Ti-Au n-contact 260 can be deposited on the surface 252 of the n-GaAs buffer layer 206.

The blue laser structure 200 with its metal confined ridge waveguide 256 will emit a single transverse mode light emission.

The blue laser structure 200 of FIG. 4 is an edge emitting array. Conventional facets (not shown) are provided on the edge of the laser structure 200. The blue laser structure 200 will emit light of blue wavelength from the active region 219 including the active layer 214 through the edge of the laser structure.

The IR/Red side by side ridge waveguide laser structure 100 of FIG. 2 will be flip-chip bonded to the blue ridge waveguide laser structure 200 of FIG. 4 to form an integrated IR/Red/Blue laser structure.

Flip-chip bonding involves soldering two semiconductor structures together in a face to face relationship to form a single semiconductor structure. Typically, solder bumps are formed on contact pads on the surfaces of each semiconductor structure. One structure or "chip" is "flipped over" to face the other structure or "chip". The solder bumps on both semiconductor structures are aligned, then pressed together while the structures are heated. The two solder bumps fuse together into one solder bump, joining the two semiconductor structures into one integrated semiconductor structure. The surface tension of the liquid solder metal pulls the two laser structures into very exact alignment.

Figure 5:
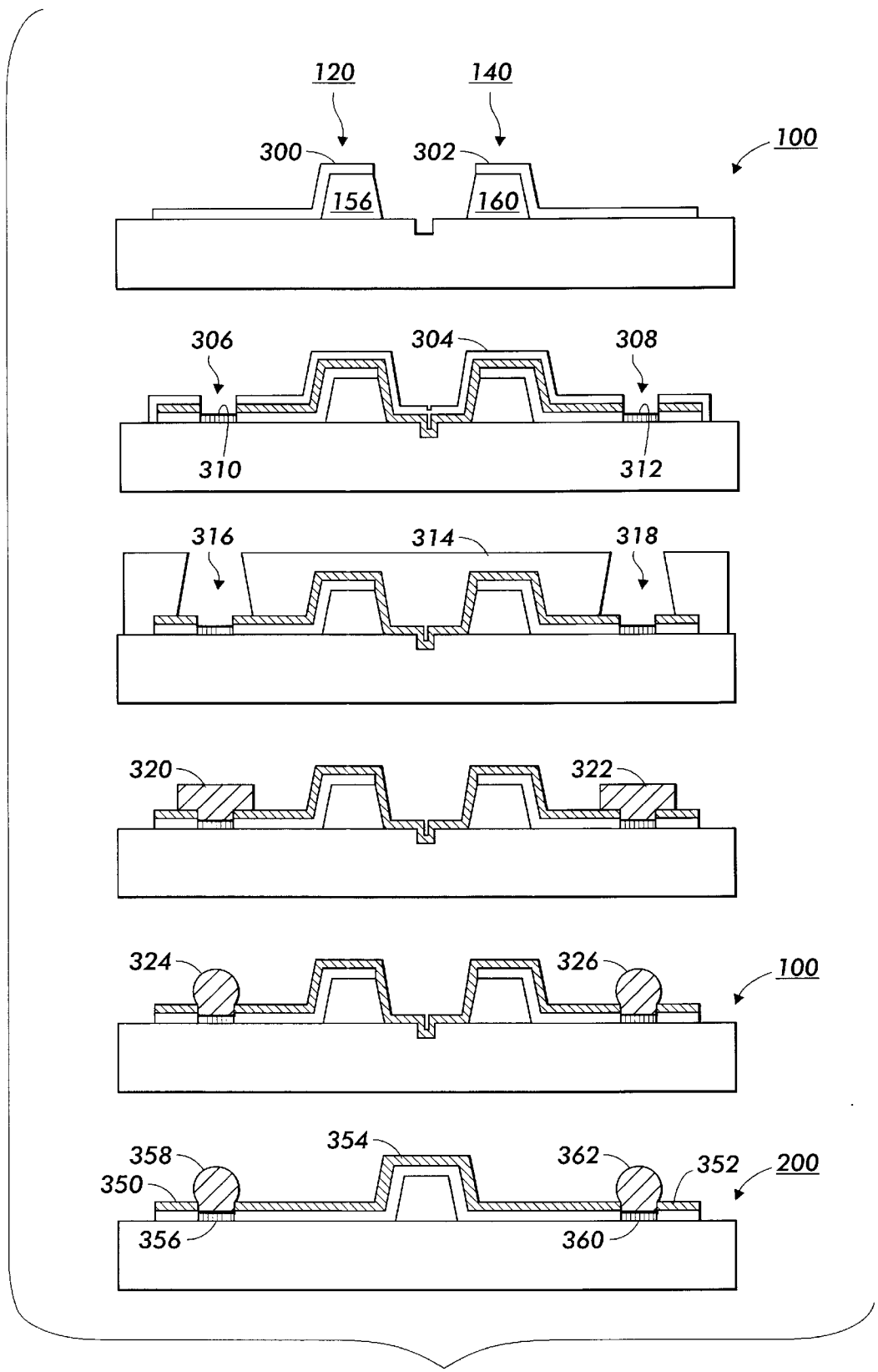
FIG. 5 is a cross-sectional side view of the solder bumps on the contact pads of the Red/IR laser structure and the Blue laser structure for flip-chip bonding of the present invention.

As shown in the illustrative example of FIG. 5, two contacts pads 300 and 302 for the solder bumps are formed on the surface of the p-type $Al_{0.5}In_{0.5}P$ upper cladding layers 114 and 134, respectively, of the Red/IR laser structure 100. The contact pad 300 overlaps the ridge waveguide 156 and the upper cladding layer 114 of the IR laser structure 120. The contact pad 302 overlaps the ridge waveguide 160 and the upper cladding layer 134 of the red laser structure 140.

The contact pads are formed by metal evaporation of successive metal layers: a 30 nanometer thick layer of Ti, a 50 nanometer thick layer of Au, a 30 nanometer thick layer of Ti and a 200 nanometer thick layer of Ni. The contact pad 300 is separated and isolated, physically and electrically, from both the ridge waveguide 156 and the p-contact 164 of the IR laser structure 120, which are also on the surface of the p-type $Al_{0.5}In_{0.5}P$ upper cladding layer 114. The contact pad 302 is separated and isolated, physically and electrically, from both the ridge waveguide 160 and the p-contact 166 of the Red laser structure 140, which are also on the surface of the p-type $Al_{0.5}In_{0.5}P$ upper cladding layer 134.

A SiON dielectric layer 304 is the deposited by plasma-enhanced chemical vapor deposition ("PECVD") or by electron beam evaporation at 275° C. over most of both contact pads 300 and 302. The SiON dielectric layer 304 will serve as a solder stop and to further electrically isolate the contact pads 300 and 302 from the p-contacts 164 and 166. The Ti/Au layers of the contact pads next to the upper cladding layer are the standard laser ohmic contact metals. The overlying Ti/Ni layers of the contact pads fulfill the somewhat conflicting requirements of acting as a low contact resistance interface between the upper cladding layer thin film metallization and the 10 to 12 micron thick Pb/Sn solder bumps and serving as a solder anti-leach layer. Furthermore, Ni forms a surface oxide stable enough to insure good SiON adhesion.

The dielectric film 304 is then patterned by using standard photolithographic procedures. A photoresist mask (not shown) is aligned with the ridge waveguides 156 and 160 and the underlying laser stripes and formed on the surface of the SiON dielectric layer 304. The unmasked portions of the SiON dielectric layer 304 are plasma etched to form contact holes 306 and 308 of 50 to 90 $\mu$m diameter. The contact hole 306 will be etched down through the dielectric film 304 to the contact pad 300. The contact hole 308 will be etched down through the dielectric film 304 to the contact pad 302. This etching step determines the final alignment between the two laser semiconductor structures and also defines the wettable contact pad area.

A 20 nanometer thick Sn layer 310 is deposited on the contact pad 300 through the contact hole 306. A 20 nanometer thick Sn layer 312 is deposited on the contact pad 302 through the contact hole 308.

A 10 micron thick layer of photoresist 314 is then deposited on the surface in a three layer pattern with a retrograde profile hole 316 developed and aligned with the contact hole 306 and a retrograde profile hole 318 developed and aligned with the contact hole 308.

PbSn solder is evaporated in an e-beam evaporator and the subsequent lift-off results in a PbSn disk 320 deposited on the Sn layer 310 on the contact pad 300 and a PbSn disk 322 deposited on the Sn layer 312 on the contact pad 302. The 10 $\mu$m thick PbSn disks are slightly larger in diameter than the wettable contact pads 300 and 302. The photoresist 314 is then removed.

The solder disks 320 and 322 are reflowed using flux and heated to temperature of 220° C. to pull back onto the wettable contact pad areas 300 and 302, respectively, and form solder bumps 324 and 326 of hemispherical shape. Solder bump 324 is on the Sn layer 310 on the contact pad 300 and solder bump 326 is on the Sn layer 312 on the contact pad 302. The Sn layer is alloyed with the PbSn solder to form a good electrical and mechanical connection.

The contact pads and solder bumps on the Blue laser structure 200 are formed by the same process. A SiON dielectric layer 354 covers most of both Ti/Au/Ti/Ni contact pads 350 and 352 on the upper surface of the upper confinement layer 220 for the blue laser structure 200. Solder bump 358 is on the Sn layer 356 on the contact pad 350 and solder bump 362 is on the Sn layer 360 on the contact pad 352.

The Figures and text show one row of solder bumps. Across the entire face of the laser structures are rows and rows of solder bumps to provide a good mechanical and electrical connection between the two laser structures.

The Red/IR laser structure 100 with its solder bumps 324 and 326 on contact pads 300 and 302 and the Blue laser structure 200 with its solder bumps 358 and 362 on contact pads 350 and 352 are separately scribed and cleaned by standard means. Tacky flux is applied to the surface of the solder bumps on both laser structures.

Figure 6:
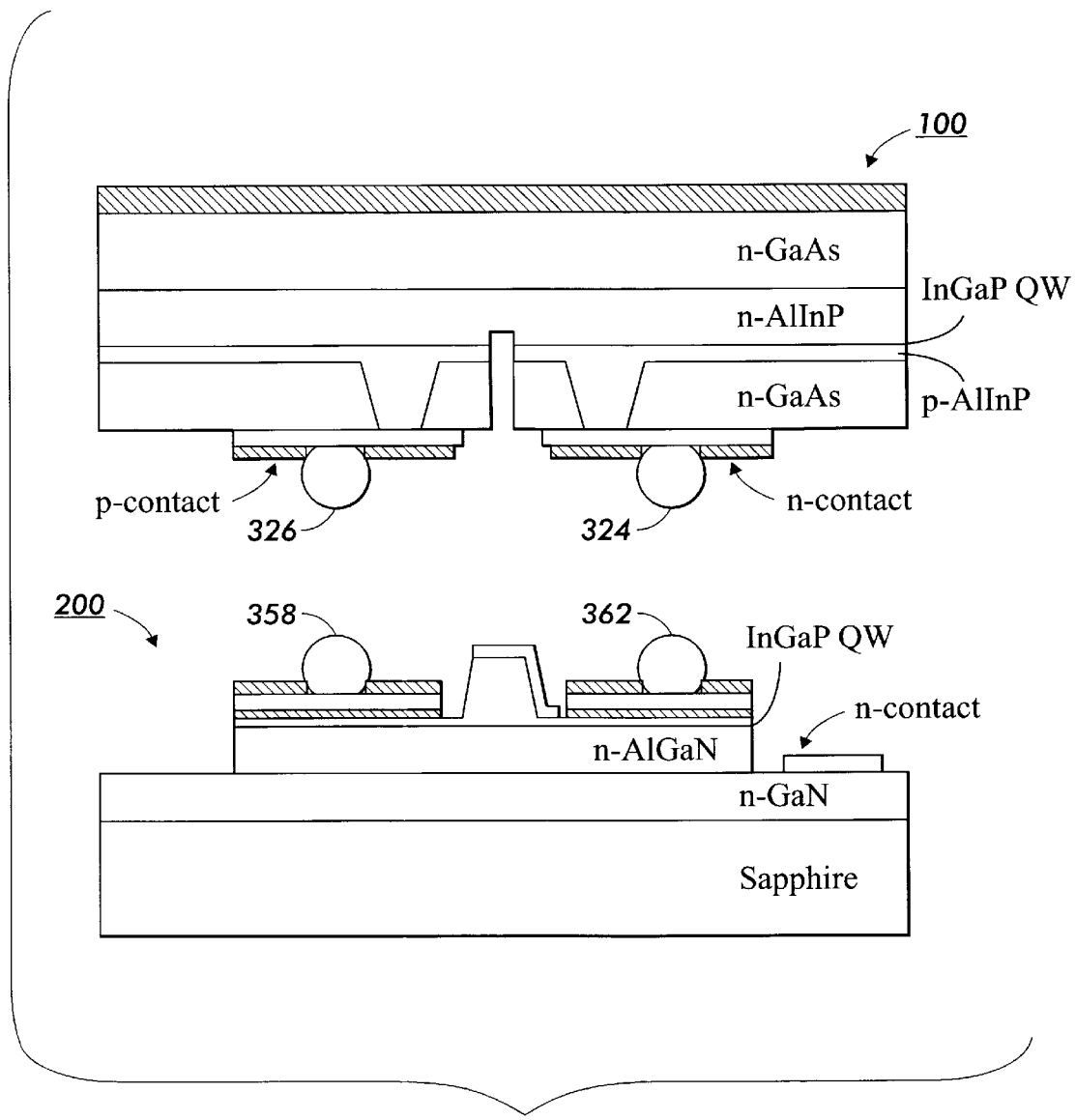
FIG. 6 is a cross-sectional side view of the semiconductor layers of the Red/IR side by side laser structure and the Blue laser structure prior to flip-chip bonding of the present invention.

As shown in FIG. 6, the GaAs Red/IR structure 100 flip-chips on top of the InGaN/sapphire Blue laser structure 200 with a positioning accuracy of ±10 μm using a flip-chip aligner bonder. The solder bumps 326 and 324 of the Red/IR laser structure 100 are attached to the solder bumps 358 and 352 of the Blue laser structure 200, respectively, and held in place by the flux.

Figure 7:
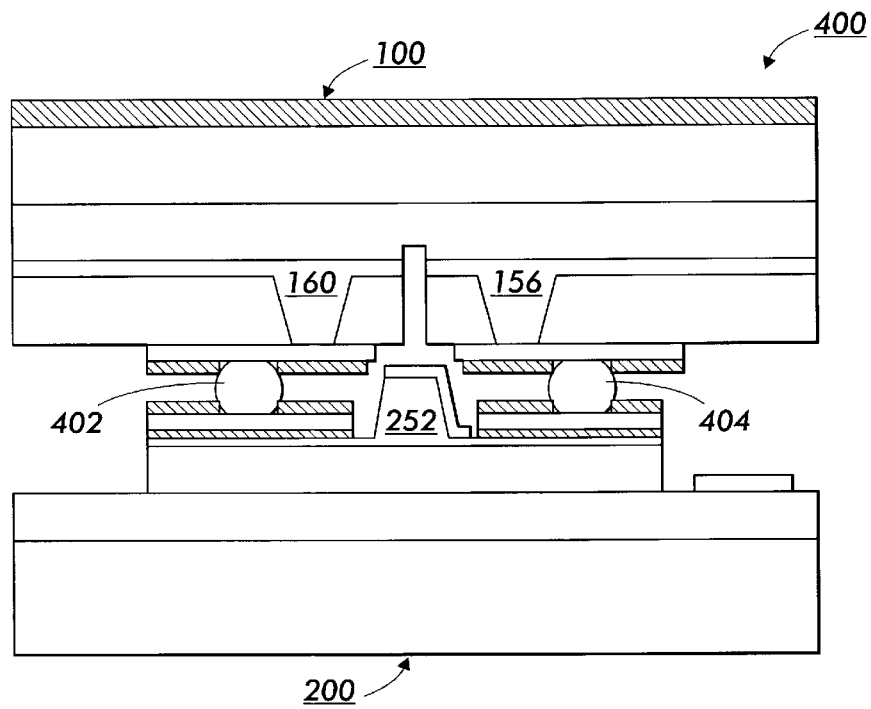
FIG. 7 is a cross-sectional side view of the semiconductor layers of the Red/Blue/IR stack laser structure formed by flip-chip bonding of the present invention.

The hybrid integrated Red/Blue/IR laser structure 400 is heated to temperature of 220° C. again. During a second reflow, the two solder bumps 326 and 358 become one solder bump 402 and the two solder bumps 324 and 352 become one solder bump 404 flip-chip bonding the two separate laser structures 100 and 200 into one integrated laser structure 400 as shown in FIG. 7. During this bonding process, the Red/IR laser structure and the Blue laser structure are pulled into very accurate alignment through the self-aligned surface tension between the Pb/Sn solder bumps.

The blue laser ridge 256 is placed in the center between the red laser ridge 160 and the IR laser ridge 156 in order to achieve close spacing in the lateral direction. The spacing in the vertical direction depends on the bump size; for solder bump hemispheres with exactly 50, 70, and 90 μm diameter, the chip separations are 30, 40 and 50 μm respectively. Since through the hybrid bonding scheme, there is only very low thermal crosstalk between the blue and the Red/IR lasers, the lateral spacing is essentially limited by the spacing between the red laser and the IR laser. If the separation between the Red laser and the IR laser is 20 μm, the separation between the Blue laser and the Red laser (or the IR laser) is only 10 μm. The separation in the vertical direction depends upon the bump diameter. In certain applications, such as a printhead, the vertical separation can be virtually zero because of an electronically adjustable delay in the Red/IR lasers. The close separation will be beneficial for high-speed and high-resolution printers.

Flip-chip bonding creates a non-lattice matched heterostructure, the hybrid integrated laser structure 400 in this embodiment. This integration of the Red/Blue/IR laser structure 400 provides a closely spaced, precisely spaced structure of three different, widely spaced wavelength laser sources, necessary for precision optical systems.

Figure 8:
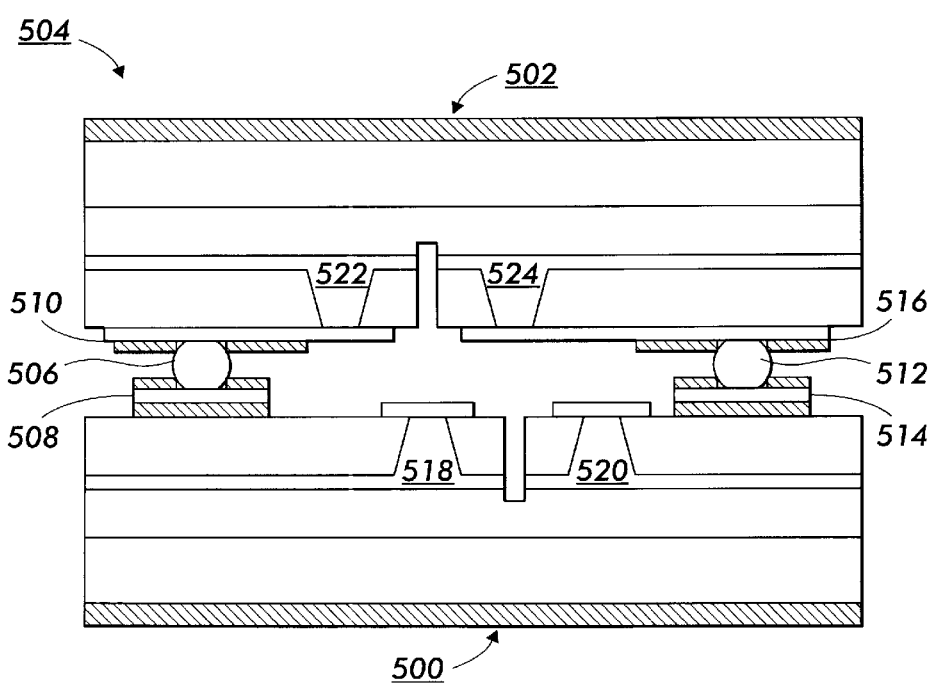
FIG. 8 is a cross-sectional side view of the semiconductor layers of the Red/IR/Red/IR stack laser structure formed by flip-chip bonding of the present invention.

Similarly, a red/red side by side ridge waveguide laser structure 500 can be flip-chip bonded to an IR/IR side by side ridge waveguide laser structure 502 to form an integrated quadspot red/IR/red/IR laser structure 504 in FIG. 8. The solder bump 506 on contact pads 508 and 510 and the solder bump 512 on contact pads 514 and 516 flip-chip bonds the two separate laser structures into one integrated laser structure.

The first red laser ridge 518 and the second red laser ridge 520 on one laser structure 500 will alternate with the first IR laser ridge 522 and the second IR laser ridge 524 on the other laser structure 502 in the integrated red/IR/red/IR laser structure 500. In this configuration, the separation between the most closely spaced lasers can be less than 10 μm.

This approach can be used to fabricate dual color quadspot laser arrays such as Red/IR and red/blue. And each separate laser structure can have two different wavelength lasers so that the flip chip bonded integrated laser structure would have four lasers with four different wavelength beams.

In summary, the use of flip-chip bonding techniques paves the way for multi-wavelength semiconductor lasers fabricated in material systems which are incompatible for etch and regrowth techniques. Such multi-wavelength devices have interesting applications in high-speed and high-resolution color-printing or scanning.

Alternately, in the Infrared/Red side by side monolithic laser structure 100 of FIG. 2, the upper cladding layer and the lower cladding layer of the infrared laser structure 120 and the upper cladding layer and the lower cladding layer of the red laser structure 140 can be the semiconductor material $(AlGa)_{0.5}In_{0.5}P$.

Reactive ion etching may be used in place of wet chemical etching.

The use of ridge waveguides are merely illustrative examples. The upper confinement layers of p-AlInP can form native oxide ridge waveguides. The specific cladding, confinement and active layers for the red, infrared and blue laser structures can be fabricated from different semiconductor materials other than those listed in this embodiment.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A method of fabricating an integrated edge-emitting semiconductor laser structure comprising the steps of:

fabricating a side by side laser structure having a first laser structure for emitting light of a first wavelength and a second laser structure for emitting light of a second wavelength, said first and second laser structure having a first and second bonding means, fabricating a third laser structure for emitting light of a third wavelength, said third laser structure having a third bonding means, flip chip bonding said first and second bonding means of said side by side laser structure to said third bonding means of said third laser structure, and forming contacts which enable independently addressable biasing of said first laser structure to emit light of said first wavelength, said second laser structure to emit light of said second wavelength and said third laser structure to emit light of said third wavelength.

2. The method of fabricating an integrated edge-emitting semiconductor laser structure of claim 1 wherein said first wavelength is in the red range, said second wavelength is in the infrared range and said third wavelength is in the blue range.

3. A method of fabricating an integrated edge-emitting semiconductor laser structure comprising the steps of:

fabricating a first side by side laser structure having a first laser structure for emitting light of a first wavelength and a second laser structure for emitting light of a second wavelength, said first and second laser structure having a first and second bonding means, fabricating a second side by side laser structure having a third laser structure for emitting light of a third wavelength and a fourth laser structure for emitting light of a fourth wavelength, said third and fourth laser structure having a third and fourth bonding means, flip chip bonding said first and second bonding means of said first side by side laser structure to said third and fourth bonding means of said second side by side laser structure, and forming contacts which enable independently addressable biasing of said first laser structure to emit light of said first wavelength, said second laser structure to emit light of said second wavelength, said third laser structure to emit light of said third wavelength and said fourth laser structure to emit light of said fourth wavelength.

4. The method of fabricating an integrated edge-emitting semiconductor laser structure of claim 3 Wherein said first wavelength, said second wavelength, said third wavelength and said fourth wavelength are different.

5. The method of fabricating an integrated edge-emitting semiconductor laser structure of claim 3 wherein said first wavelength is the same as said second wavelength, said third wavelength is the same as said fourth wavelength and said first wavelength is different from said third wavelength.

6. The method of fabricating an integrated edge-emitting semiconductor laser structure of claim 3 wherein said first wavelength is the same as said third wavelength, said second wavelength is the same as said fourth wavelength and said first wavelength is different from said second wavelength.

* * * * *

UNITED STATES PATENT AND TRADEMARK OFFICE
CERTIFICATE OF CORRECTION

| | | |
|---|---|---|
| PATENT NO. | : 6,136,623 | Page 1 of 1 |
| APPLICATION NO. | : 09/073598 | |
| DATED | : October 24, 2000 | |
| INVENTOR(S) | : Daniel Hofstetter et al. | |

It is certified that error appears in the above-identified patent and that said Letters Patent is hereby corrected as shown below:

Column 1, line 3, insert as a new paragraph:

This invention was made with Government support under Agreement No. 70NANB2H1241 awarded by the Department of Commerce. The Government has certain rights in this invention.

Signed and Sealed this

Eleventh Day of July, 2006

JON W. DUDAS
*Director of the United States Patent and Trademark Office*